United States Patent
Kim et al.

(10) Patent No.: US 11,212,911 B2
(45) Date of Patent: Dec. 28, 2021

(54) APPARATUS FOR NON-CONTACTIVE SENSOR HAVING ESD PROTECTION STRUCTURE

(71) Applicant: Mando Corporation, Pyeongtaek-si (KR)

(72) Inventors: Nam Gyun Kim, Gwangju-si (KR); Jong Hak Jin, Seongnam-si (KR); Doo Jin Lee, Osan-si (KR)

(73) Assignee: MANDO CORPORATION, Pyeongtaek-si (KR)

( * ) Notice: Subject to any disclaimer, the term of this patent is extended or adjusted under 35 U.S.C. 154(b) by 153 days.

(21) Appl. No.: 16/557,042

(22) Filed: Aug. 30, 2019

(65) Prior Publication Data

US 2020/0077511 A1 Mar. 5, 2020

(30) Foreign Application Priority Data

Aug. 31, 2018 (KR) .................. 10-2018-0103414
Aug. 31, 2018 (KR) .................. 10-2018-0103418

(51) Int. Cl.
| | |
|---|---|
| *H05K 1/00* | (2006.01) |
| *H05K 1/02* | (2006.01) |
| *H02H 9/04* | (2006.01) |
| *G01L 5/22* | (2006.01) |
| *G01D 5/20* | (2006.01) |
| *G01D 5/24* | (2006.01) |
| *B62D 5/04* | (2006.01) |

(52) U.S. Cl.
CPC ............. *H05K 1/0259* (2013.01); *G01D 5/20* (2013.01); *G01D 5/24* (2013.01); *G01L 5/221* (2013.01); *H02H 9/045* (2013.01); *B62D 5/049* (2013.01); *H05K 2201/10151* (2013.01)

(58) Field of Classification Search
CPC ....... H05K 1/0259; H05K 2201/10151; G01D 5/20; G01D 5/24; G01L 5/221; H02H 9/045; B62D 5/049
See application file for complete search history.

(56) References Cited

U.S. PATENT DOCUMENTS

| | | | |
|---|---|---|---|
| 10,021,470 B2* | 7/2018 | Silvestri | H04R 9/02 |
| 2006/0163707 A1* | 7/2006 | Hooi | H05K 3/301 |
| | | | 257/678 |
| 2009/0051595 A1* | 2/2009 | Wang | H01Q 1/38 |
| | | | 343/700 MS |

* cited by examiner

*Primary Examiner* — Pete T Lee
(74) *Attorney, Agent, or Firm* — Hauptman Ham, LLP (57) ABSTRACT

The present disclosure relates to an apparatus for a non-contactive sensor having an ESD protection structure, and an apparatus for a non-contactive sensor having an ESD protection structure according to one embodiment of the present disclosure includes: a sensing member that acquires sense information emitted from a detection target object; a circuit board that is separately positioned below the sensing member and includes a sensor IC and one or more grounds; and an ESD protection element that is positioned on the circuit board and encloses a part of the sensor IC protruding on the circuit board.

19 Claims, 10 Drawing Sheets

APPARATUS FOR NON-CONTACTIVE SENSOR HAVING ESD PROTECTION STRUCTURE

CROSS-REFERENCE TO RELATED APPLICATION

This application claims priority from Korean Patent Application Nos. 10-2018-0103418 and 10-2018-0103414, filed on Aug. 31, 2018, which is hereby incorporated by reference for all purposes as if fully set forth herein.

BACKGROUND OF THE INVENTION

Field of the Invention

The present disclosure relates to an apparatus for a non-contactive sensor having an ESD protection structure, and more particularly, to an apparatus for a non-contactive sensor having a structure for preventing a damage in a sensor circuit according to ESD by blocking static electricity and an apparatus for a non-contactive sensor having a structure for preventing a damage in a sensor circuit according to ESD by generating a path through which static electricity is applied to the ground GND.

Description of Related Art

Generally, in the case of various mechanical apparatuses such as a steering wheel, a fuel gauge, and a braking apparatus of a vehicle, it is very important to measure accurate values of a rotation angle, a linear migration distance, and the like. Thus, various sensors are mounted and used for measuring a steering angle of a vehicle, and various displacement sensors and the like are mounted for measuring a linear migration distance.

Particularly, various non-contactive sensors such as a light detecting sensor having a scheme using emission and reception of light, an inductance-type displacement detecting sensor using inductance of a coil, an electrostatic capacitive sensor using electrostatic capacity, and a magnetic field sensor using changes in a magnetic field are used.

When a detection target object approaches a coupler or a coil of a sensor IC and rotates or linearly moves, a magnetic field, capacitance, inductance, or the like changes, and a conventional non-contactive sensor is formed to detect the amount of such changes.

However, such a non-contactive sensor is directly exposed to electro-static discharge (hereinafter, referred to ESD) and thus has a structure vulnerable to ESD, and accordingly, there are problems such as damages and malfunctions of electromagnetic apparatuses due to ESD. At this time, ESD represents a phenomenon in which violent discharge occurs when a charged conductor is brought into contact with or sufficiently approaches another conductor.

SUMMARY OF THE INVENTION

In order to solve the problems described above, the present disclosure provides an apparatus for a non-contactive sensor having an ESD protection structure blocking static electricity applied to an internal circuit of the sensor.

In other words, according to one aspect, there is provided an apparatus for a non-contactive sensor having a structure for preventing damages in a sensor circuit due to ESD by blocking static electricity. According to another aspect, there is provided an apparatus for a non-contactive sensor having a structure for preventing damages in a sensor circuit due to ESD by generating a path guiding static electricity to the ground.

Objects to be achieved by the present disclosure are not limited to those mentioned above, and other objects that are not mentioned can be clearly understood by a person skilled in the art based on the following description.

In order to achieve the object described above, an apparatus for a non-contactive sensor having an ESD protection structure according to one embodiment of the present disclosure may include: a sensing member that acquires sense information emitted from a detection target object; a circuit board that is separately positioned below the sensing member and includes a sensor IC and one or more grounds; and an ESD protection element that is positioned on the circuit board and encloses a part of the sensor IC protruding on the circuit board.

In addition, an apparatus for a non-contactive sensor having an ESD protection structure according to another embodiment of the present disclosure may include: a sensing member that acquires sense information emitted from a detection target object; a circuit board that is separately positioned below the sensing member and includes a sensor IC and one or more grounds; and an ESD protection element that connects the circuit board and the sending member and forms a path through which static electricity is applied to the ground.

Specific matters of the present disclosure are included in detailed description and the drawings.

As described above, according to the present disclosure, ESD is effectively prevented without addition of an ESD protection circuit pattern or a structural change of a sensor apparatus, and accordingly, there is an advantage of reducing the cost. In addition, since an ESD protection element is formed using a material minimizing an influence on a signal detected from a detection target object, there is an advantage of improving the reliability of a sensor apparatus.

DETAILED DESCRIPTION OF THE INVENTION

Hereinafter, preferred embodiments of the present disclosure will be described in detail with reference to the attached drawings. Advantages and features of the present disclosure, and methods for achieving those will become apparent by referring to exemplary embodiments described in detail below with reference to the attached drawings. However, the present disclosure is not limited to embodiments disclosed below but may be embodied in many different forms, rather, these embodiments are provided so that this disclosure will be thorough and complete, and will fully convey the concept of the present disclosure to those skilled in the art, and scope of the present disclosure is as defined by the appended claims. Like reference numerals in the drawings denote like elements.

Although "first", "second", and the like are used for describing various elements, constituent elements, and/or sections, the elements, the constituent elements and/or the sections are not limited thereto. These terms are used only for distinguishing one element, one constituent element, one section, or the like from other elements, constituent elements, sections, or the like. Thus, it is apparent that a first element, a first constituent element, or a first section described below may be a second element, a second constituent element, or a second section within the technical ideas of these embodiments.

Figure 1:
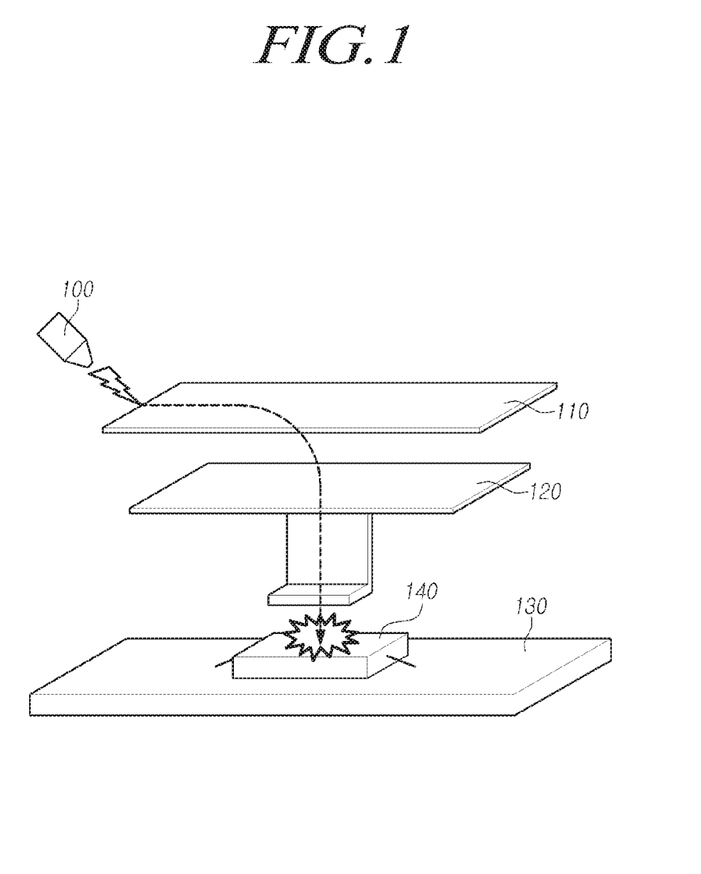
FIG. 1 is a perspective view schematically illustrating the structure of a conventional apparatus for a non-contactive sensor.

Terms used here are used for describing embodiments but are not for limiting these embodiments. In description here, a singular form includes a plural form unless otherwise mentioned. "Comprises" and/or "comprising" used here in describing a constituent element, a step, an operation and/or an element do not exclude presence or addition of one or more other constituent elements, steps, operations and/or elements. FIG. 1 is a perspective view schematically illustrating the structure of a conventional apparatus for a non-contactive sensor. Referring to FIG. 1, generally, an apparatus for a non-contactive sensor may be configured by a sensing member 120 that detects an amount of change in a magnetic field, capacitance, inductance, or the like and a circuit board 130 that is separate from the sensing member 120 by a predetermined gap and includes a sensor IC 140 measuring an amount of change. At this time, FIG. 1 illustrates a case in which ESD is generated in a conventional apparatus for a non-contactive sensor by applying static electricity to a detection target object 110 using an ESD simulator 100. As illustrated in the drawing, static electricity is transmitted to the sensor IC 140 via the sensing member 120 through the detection target object 110, and the circuit of the sensor IC 140 may be damaged in accordance with such a phenomenon.

The apparatus for a non-contactive sensor illustrated in FIG. 1 will be described as an apparatus for a non-contactive torque sensor included in a steering apparatus that detects a rotation angle difference between an input shaft and an output shaft as an example.

At this time, the apparatus for a non-contactive torque sensor included in the steering apparatus may be provided for measuring a steering angle deviation between a steering wheel and front wheels or rear wheels of a vehicle and compensating the deviation. In other words, the apparatus for a non-contactive torque sensor is an apparatus that measures a rotation angle deviation between a steering wheel and front wheels or rear wheels and steering the vehicle in a direction for advancement safely and accurately using a steering assist power motor corresponding to the measured deviation.

The detection target object 110 illustrated in FIG. 1 may be a part of a rotor rotating to be linked with the output shaft, and the sensing member 120 that is positioned to be separate from the rotor by a predetermined gap and detects the amount of change in a magnetic field may be a collector of a non-contactive torque sensor. The circuit board 130 including the sensor IC 140 may be a circuit board of a non-contactive torque sensor that determines a deviation by measuring the amount of change in the magnetic field.

At this time, a gap between the collector of the apparatus for the non-contactive torque sensor and the sensor IC 140 is a sole path through which static electricity is distributed, and in order to secure the performance of the sensor IC 140, the gap is required to be a minimum.

However, in order to prevent damages in the sensor IC 140 due to ESD, in other words, in order to minimize the influence of static electricity, the impedance needs to be increased, which can be achieved by increasing the gap. Accordingly, there is a problem in that the performance of the sensor IC 140 is degraded.

Alternatively, in order to prevent damages in the sensor IC 140 due to ESD, while an additional ESD protection circuit pattern may be formed to be positioned on the periphery of the sensor IC 140 on the circuit board 130. However, since that may cause other structural problems, the sensor IC 140 may be rather damaged, and there is a problem in that the ESD protection circuit pattern positioned outside the sensor IC 140 cannot prevent internal damages of the sensor IC 140.

Hereinafter, the present disclosure will be described in more detail with reference to the attached drawings.

Figure 2:
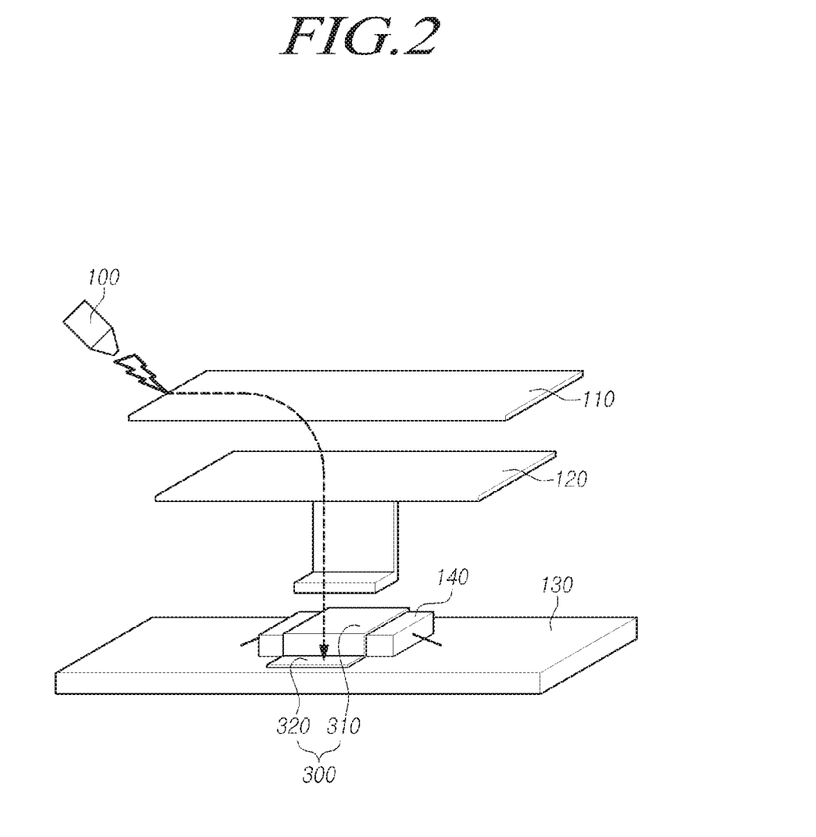
FIG. 2 is a perspective view schematically illustrating the structure of an apparatus for a non-contactive sensor having an ESD protection element according to one embodiment of the present disclosure.
Figure 3:
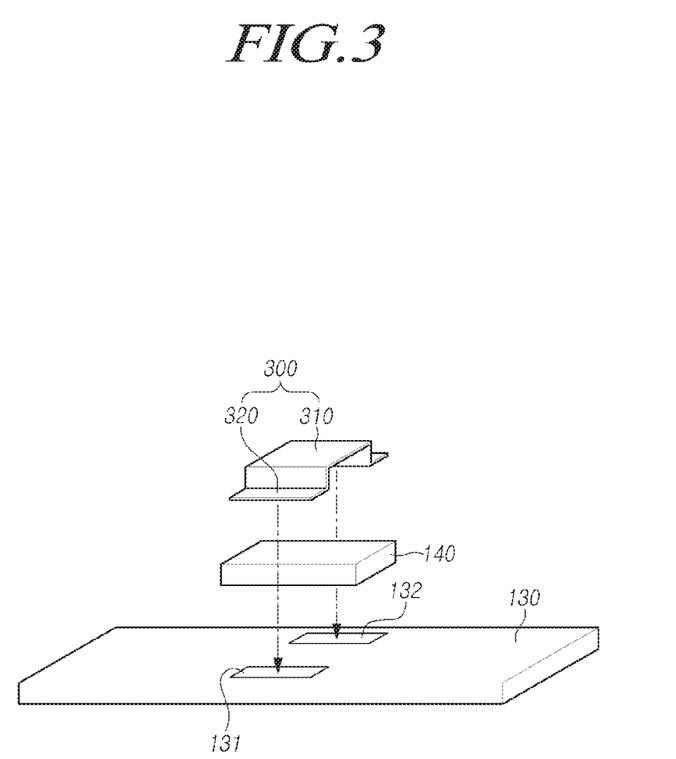
FIG. 3 is an exploded perspective view of an ESD protection element and a circuit board according to one embodiment of the present disclosure.
Figure 4:
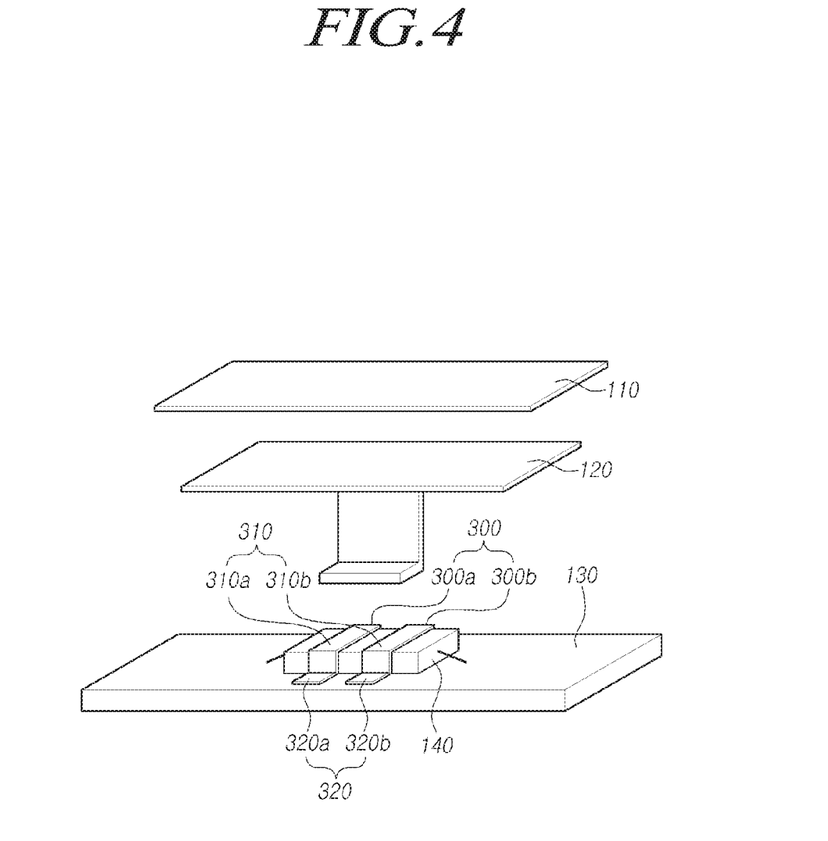
FIG. 4 is a perspective view illustrating a plurality of cover members in an apparatus for a non-contactive sensor having an ESD protection element according to one embodiment of the present disclosure.

FIG. 2 is a perspective view schematically illustrating the structure of an apparatus for a non-contactive sensor having an ESD protection element according to one embodiment of the present disclosure, FIG. 3 is an exploded perspective view of an ESD protection element 300 and a circuit board 130 according to one embodiment of the present disclosure, and FIG. 4 is a perspective view illustrating a plurality of cover members 310 in an apparatus for a non-contactive sensor having an ESD protection element according to one embodiment of the present disclosure. Referring to FIGS. 2 and 3, an apparatus for a non-contactive sensor having an ESD protection structure according to one embodiment of the present disclosure may include: a sensing member 120 that acquires sense information emitted from a detection target object 110; a circuit board 130 that is separately positioned below the sensing member 120 and includes a sensor IC 140 and one or more grounds 131 and 132; and an ESD protection element 300 that is positioned on the circuit board 130 and encloses a part of the sensor IC 140 protruding on the circuit board 130.

At this time, sense information may include at least one or more of capacitance, an electromagnetic field, and inductance.

A circuit pattern of the sensor IC 140 may be formed based on the sense information. In other words, if the sense information is the amount of change in capacitance, the circuit pattern of the sensor IC 140 may be a circuit pattern enabling the sensor IC 140 to measure the capacitance.

In addition, if the sense information is the amount of change in the magnetic field, the circuit pattern of the sensor IC 140 may be a circuit pattern enabling the sensor IC 140 to measure a magnetic field.

On the other hand, if the sense information is the amount of change in inductance, the circuit pattern of the sensor IC 140 may be a circuit pattern enabling the sensor IC 140 to measure inductance.

As one example, the sense information is a magnetic field, and the sensor IC 140 may be a torque sensor IC included in a steering apparatus of a vehicle.

In other words, the apparatus for a non-contactive sensor having an ESD protection structure according to one embodiment of the present disclosure illustrated in FIG. 2 may be applied to an apparatus for a non-contactive torque sensor included in a steering apparatus.

In other words, the detection target object 110 illustrated in FIG. 2 may be a part of a rotor rotating to be linked with an output shaft, and the sense member 120 is positioned to be separate from the rotor by a predetermined gap and can detect the amount of change in the magnetic field and may be a collector of a non-contactive torque sensor. The circuit board 130 including the sensor IC 140 may be a circuit board of a non-contactive torque sensor that measures the amount of change in the magnetic field and determines a deviation.

Accordingly, as illustrated in FIG. 2, if a user or the like applies static electricity to the rotor using an ESD simulator 100, the static electricity distributed to the collector of the non-contactive torque sensor through the rotor is not distributed to the sensor IC 140 and can be blocked by the ESD protection element 300.

As another example, the sense information may be capacitance, and the sensor IC 140 may be a touch sensor IC included in a vehicle. Here, the touch sensor IC may detect whether a user's finger is positioned very close to a detection target object 110.

In addition, as another example, the sense information may be inductance, and the sensor IC may be a gap sensor IC included in a vehicle. Here, the gap sensor IC may represent an induction-type proximity sensor IC.

At this time, the ESD protection element 300 may form a cover member 310 enclosing an upper part and side parts of the sensor IC 140 and generate a plurality of support members 320 that are brought into contact with grounds 131 and 132. Accordingly, the ESD protection element 300 can block static electricity applied to the sensor IC 140.

As illustrated in FIG. 3, the plurality of support members 320 may be respectively connected to a first ground 131 and a second ground 132 formed on the circuit board 130. At this time, since the grounds (GND; grounds 131 and 132) are brought into contact with the support member 320 of the ESD protection element 300 as the grounds of the circuit board 130, the grounds 131 and 132 may cause the static electricity to flow to the grounds 131 and 132.

Here, a plurality of cover members 310 may be formed. Referring to FIG. 4, for example, the cover member 310 may include a first cover member 310*a* and a second cover member 310*b*. The area of each of the first cover member 310*a* and the second cover member 310*b* is smaller than the area of the sensor IC 140. However, the relation between the areas is not limited thereto.

Meanwhile, the cover member 310, as illustrated in FIGS. 2 to 4, may be disposed to be brought into contract with the sensor IC 140 but is not limited thereto, and the cover member 310 may be disposed to be separate from an upper part of the sensor IC 140.

The ESD protection element 300 may be formed in a sheet form, and the thickness thereof may be in the range of 50 μm to 500 μm, but is not limited thereto and may be a thickness not interfering with the distribution of sense information. As the thickness of the ESD protection element 300 increases, ESD can be effectively prevented, which is preferable.

In addition, in order to minimize the interference when sense information is distributed from the sense member 120 to the sensor IC 140 and guide the static electricity to the grounds 131 and 132, the ESD protection element 300 may be formed using a non-magnetic conductive material. Accordingly, the ESD protection element 300 may be formed using any one or more selected from a non-magnetic group composed of compounds or mixtures including Cu, Cr, Si, B, Ti, Zn, K, Li, and Al. Particularly, the ESD protection element 300 is preferably formed using a compound or a mixture including Cu or Al. The reason for this is that Cu or Al has low impedance and can minimize the interference on the distribution of sense information.

In addition, the shape of the ESD protection element 300 may be a rectangular sheet formed using a compound or a mixture composed of a non-magnetic material but is not limited to shapes illustrated in FIGS. 2 and 3 and may be a shape not causing a delay and distortion in sense information in a case in which capacitance, a magnetic field, and inductance that are sense information is distributed to the sensor IC 140.

As described above, according to the apparatus for a non-contactive sensor having an ESD protection structure according to one embodiment of the present disclosure, ESD is effectively prevented without addition of an ESD protection circuit pattern or a structural change of the sensor apparatus, and accordingly, there is an advantage of reducing the cost. In addition, since the ESD protection element is formed using a material that can minimize the influence on a signal detected from a detection target object, there is an advantage of improving the reliability of the sensor apparatus.

Figure 5:
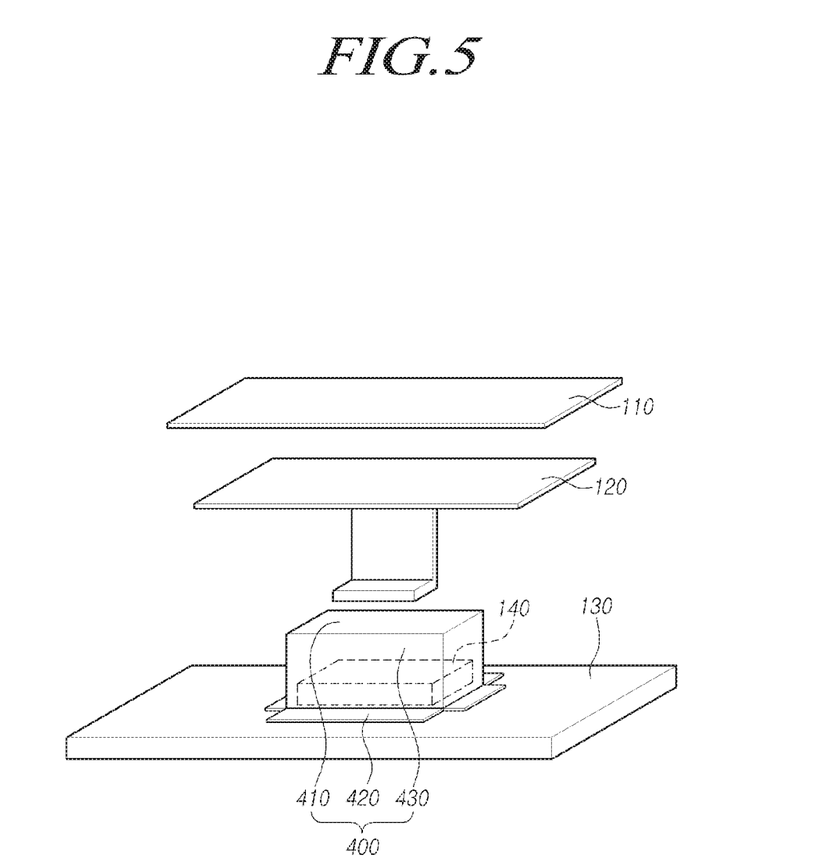
FIG. 5 is a perspective view schematically illustrating the structure of an apparatus for a non-contactive sensor having an ESD protection element according to another embodiment of the present disclosure.
Figure 6:
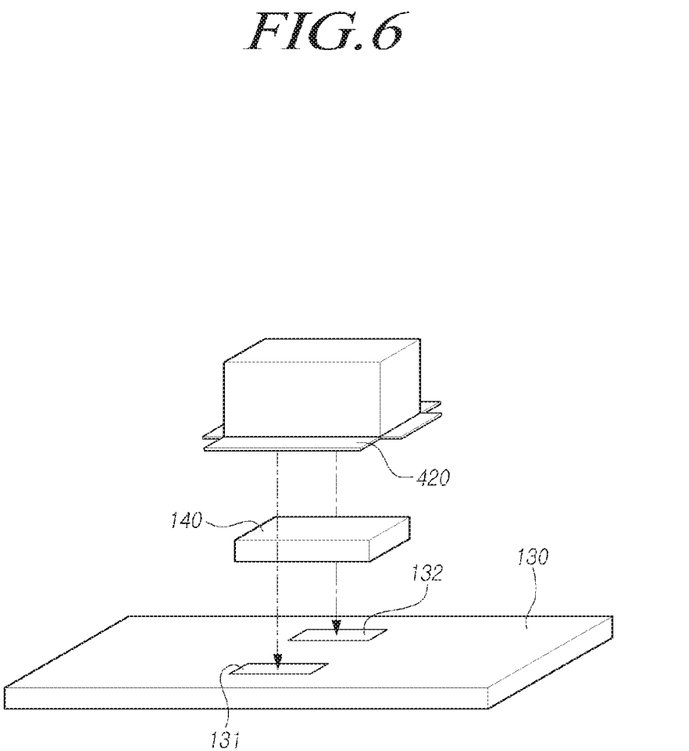
FIG. 6 is an exploded perspective view of an ESD protection element and a circuit board according to another embodiment of the present disclosure.

FIG. 5 is a perspective view schematically illustrating the structure of an apparatus for a non-contactive sensor having an ESD protection element according to another embodiment of the present disclosure, and FIG. 6 is an exploded perspective view of an ESD protection element and a circuit board according to another embodiment of the present disclosure.

Referring to FIGS. 5 and 6, an apparatus for a non-contactive sensor having an ESD protection structure according to another embodiment of the present disclosure may include: a sensing member 120 that acquires sense information emitted from a detection target object 110; a circuit board 130 that is separately positioned below the sensing member 120 and includes a sensor IC 140 and one or more grounds (not illustrated); and an ESD protection element 400 that is positioned on the circuit board 130 and encloses entirely the sensor IC 140 protruding on the circuit board 130.

Here, the detection target object 110, the sense member 120, the circuit board 130, and the sensor IC 140 included in the apparatus for a non-contactive sensor illustrated in FIG. 5 are the same as those described above with reference to FIGS. 1 to 4.

A first member 410 of the ESD protection element 400 may be separate from an upper part of the sensor IC 140, a second member 420 of the ESD protection element 400 may be connected to the grounds 131 and 132 illustrated in FIG. 6, and a third member 430 of the ESD protection element 400 may be separate from a side part of the sensor IC 140.

Here, the second member 420 of the ESD protection element 400, as illustrated in FIGS. 5 and 6, may be disposed in correspondence with the third member 430 of the ESD protection element 400, but is not limited thereto, and may be disposed only in a part of the third member 430 of the ESD protection element 400.

Meanwhile, two grounds 131 and 132 are illustrated in FIG. 6 but are not limited thereto, and the number thereof may be three or more.

The shape of the ESD protection element 400 may be a shape not causing a delay and distortion of sense information in a case in which a magnetic field and inductance are distributed to the sensor IC 140.

As described above, according to the apparatus for a non-contactive sensor having an ESD protection structure according to another embodiment of the present disclosure, ESD is effectively prevented without addition of an ESD protection circuit pattern or a structural change of the sensor apparatus, and accordingly, there is an advantage of reducing the cost. In addition, since the ESD protection element is formed using a material that can minimize the influence on a signal detected from a detection target object, there is an advantage of improving the reliability of the sensor apparatus.

Figure 7:
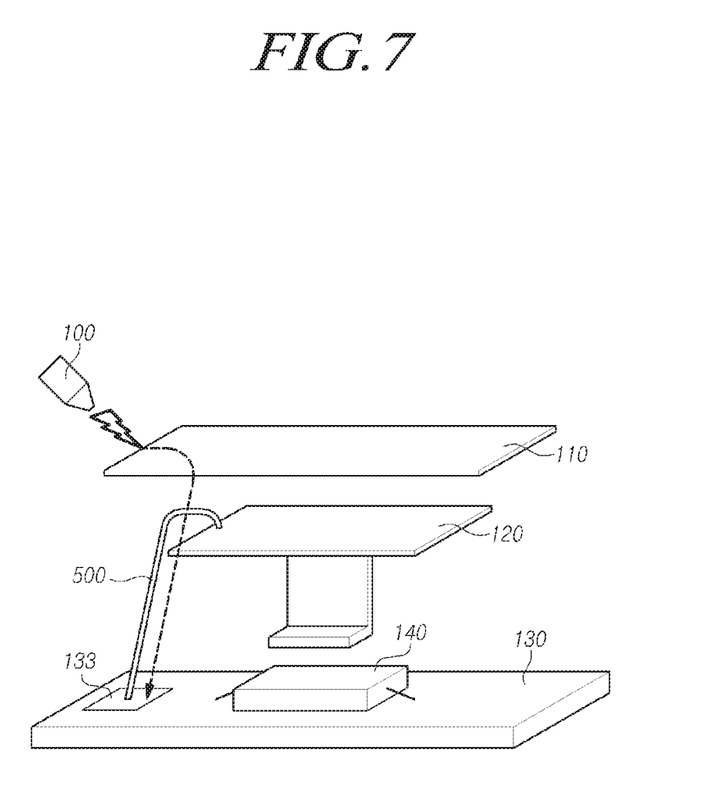
FIG. 7 is a perspective view schematically illustrating the structure of an apparatus for a non-contactive sensor having an ESD protection element according to yet another embodiment of the present disclosure.
Figure 8:
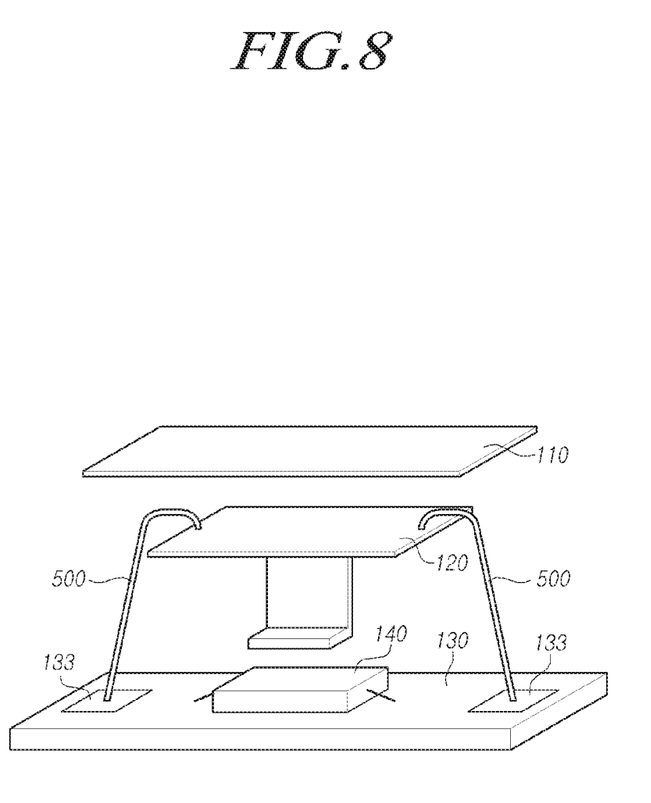
FIG. 8 is a perspective view illustrating a plurality of ESD protection elements in an apparatus for a non-contactive sensor having an ESD protection element according to yet another embodiment of the present disclosure.

FIG. 7 is a perspective view schematically illustrating the structure of an apparatus for a non-contactive sensor having an ESD protection element according to yet another embodiment of the present disclosure, and FIG. 8 is a perspective view illustrating a plurality of ESD protection elements in an apparatus for a non-contactive sensor having an ESD protection element according to yet another embodiment of the present disclosure.

Referring to FIG. 7, an apparatus for a non-contactive sensor having an ESD protection structure according to yet another embodiment of the present disclosure may include: a sensing member 120 that acquires sense information emitted from a detection target object 110; a circuit board 130 that is separately positioned below the sensing member 120 and includes a sensor IC 140 and one or more third grounds 133; and an ESD protection element 500 that connects the circuit board 130 and the sense member 120 and forms a path through which static electricity is guided to the third grounds 133.

As described above, the sense information may include at least one or more of capacitance, a magnetic field, and inductance, and the circuit pattern of the sensor IC 140 may be formed based on the sense information.

As one example, the sense information is a magnetic field, the sensor IC 140 may be a torque sensor IC included in a steering apparatus of a vehicle, the detection target object 110 illustrated in FIG. 7 may be a part of a rotor rotating to be linked with an output shaft, and the sense member 120 may be a collector of a non-contactive torque sensor that is positioned to be separate from the rotor by a predetermined gap and detects the amount of change in the magnetic field. The circuit board 130 including the sensor IC 140 may be a circuit board of a non-contactive torque sensor that measures the amount of change in the magnetic field and determines a deviation.

Accordingly, as illustrated in FIG. 7, if a user or the like applies static electricity to the rotor using an ESD simulator 100, the static electricity distributed to the collector of the non-contactive torque sensor through the rotor is not distributed to the sensor IC 140 and can be applied to the ESD protection element 500 and can be eliminated through the third ground 133.

As another example, the sense information may be capacitance, and the sensor IC may be a touch sensor IC included in a vehicle.

In addition, as another example, the sense information may be inductance, and the sensor IC may be a gap sensor IC included in a vehicle.

At this time, one side of the ESD protection element 500 may be brought into contact with the sense member 120, and the other side may be brought into contact with the third ground 133. Accordingly, the ESD protection element 500 blocks static electricity applied to the sensor IC 140, whereby damages in the sensor IC 140 due to an occurrence of ESD can be prevented. In other words, the third ground 133 is the ground of the circuit board 130, and the ESD protection element 500 functions as a path of static electricity, whereby the static electricity is caused to flow to the third ground 133.

The ESD protection element 500 is formed in a rod shape such as a stick structure, and a thickness thereof may be in the range of 50 μm to 500 μm, but is not limited thereto, and may have a thickness and a shape not interfering with distribution of sense information and easily connecting the sense member 120 and the third ground 133. ESD can be effectively prevented as the thickness of the ESD protection element 500 increases, which is preferable.

In addition, a plurality of ESD protection elements 500 may be disposed, and one side of each of the plurality of ESD protection elements 500 may be brought into contact with the sense member 120, and the other side thereof may be brought into contact with the third ground 133. Referring to FIG. 8, for example, each of two ESD protection elements 500 is brought into contact with the sense member 120 and the third ground 133. However, the configuration is not limited thereto.

In addition, in order to minimize the interference when sense information is distributed from the sense member 120 to the sensor IC 140 and guide the static electricity to the third ground 133, the ESD protection element 500 may be formed using a non-magnetic conductive material. Accordingly, the ESD protection element 500 may be formed using any one or more selected from a non-magnetic group composed of compounds or mixtures including Cu, Cr, Si, B, Ti, Zn, K, Li, and Al. Particularly, the ESD protection element 500 is preferably formed using a compound or a mixture including Cu or Al. The reason for this is that Cu or Al has low impedance and can minimize the interference on the distribution of sense information.

In addition, the shape of the ESD protection element 500 may has a rod structure formed using a compound or a mixture composed of a non-magnetic material but is not limited to shapes illustrated in FIG. 7 and may be a shape not causing a delay and distortion in sense information in a case in which capacitance, a magnetic field and inductance that are sense information is distributed to the sensor IC 140.

As described above, according to the apparatus for a non-contactive sensor having an ESD protection structure according to yet another embodiment of the present disclosure, ESD is effectively prevented without addition of an ESD protection circuit pattern or a structural change of the sensor apparatus, and accordingly, there is an advantage of reducing the cost. In addition, according to the apparatus for a non-contactive sensor having an ESD protection structure according to yet another embodiment of the present disclosure, since the ESD protection element is formed using a material that can minimizing the influence on a signal detected from a detection target object, there is an advantage of improving the reliability of the sensor apparatus.

Figure 9:
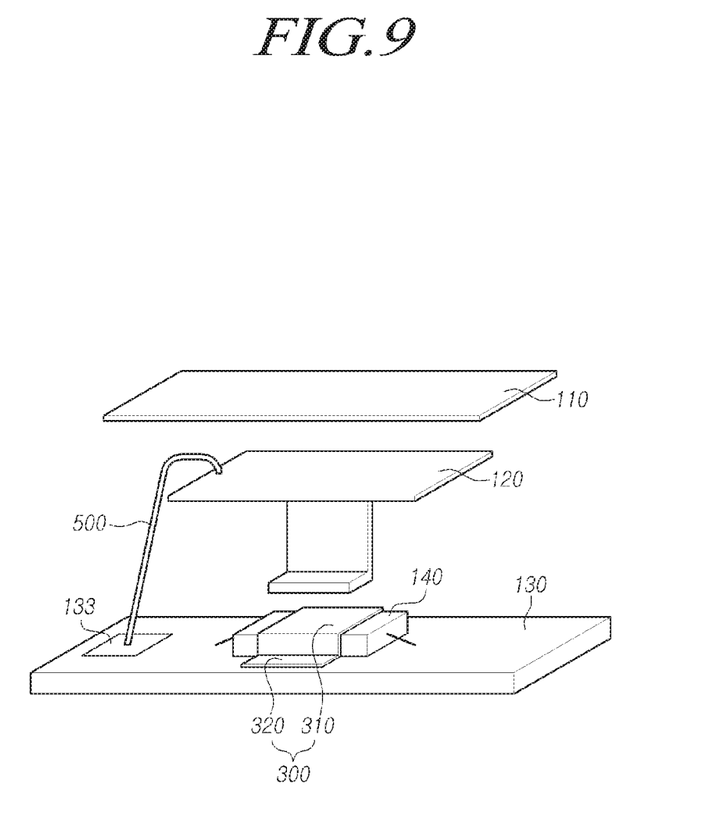
FIG. 9 is a perspective view schematically illustrating the structure of an apparatus for a non-contactive sensor having an ESD protection element according to further another embodiment of the present disclosure.

FIG. 9 is a perspective view schematically illustrating the structure of an apparatus for a non-contactive sensor having an ESD protection element according to further another embodiment of the present disclosure.

Referring to FIG. 9, an apparatus for a non-contactive sensor having an ESD protection structure according to further another embodiment of the present disclosure may include: a sensing member 120 that acquires sense information emitted from a detection target object 110; a circuit board 130 that is separately positioned below the sensing member 120 and includes a sensor IC 140 and one or more grounds 131 and 132; a first ESD protection element 300 that is positioned on the circuit board 130 and encloses a part of the sensor IC 140 protruding on the circuit board 130, and a second ESD protection element 500 that connects the circuit board 130 and the sensing member 120 and forms a path through which static electricity is applied to the ground 133.

Here, the first ESD protection element 300 is the same as the ESD protection element described with reference to FIGS. 2 to 4, and the second ESD protection element 500 is the same as the ESD protection element described with reference to FIGS. 7 and 8.

Details described with reference to FIGS. 2, 4, 7, and 8 can be applied also to the apparatus for a non-contactive sensor illustrated in FIG. 9.

Figure 10:
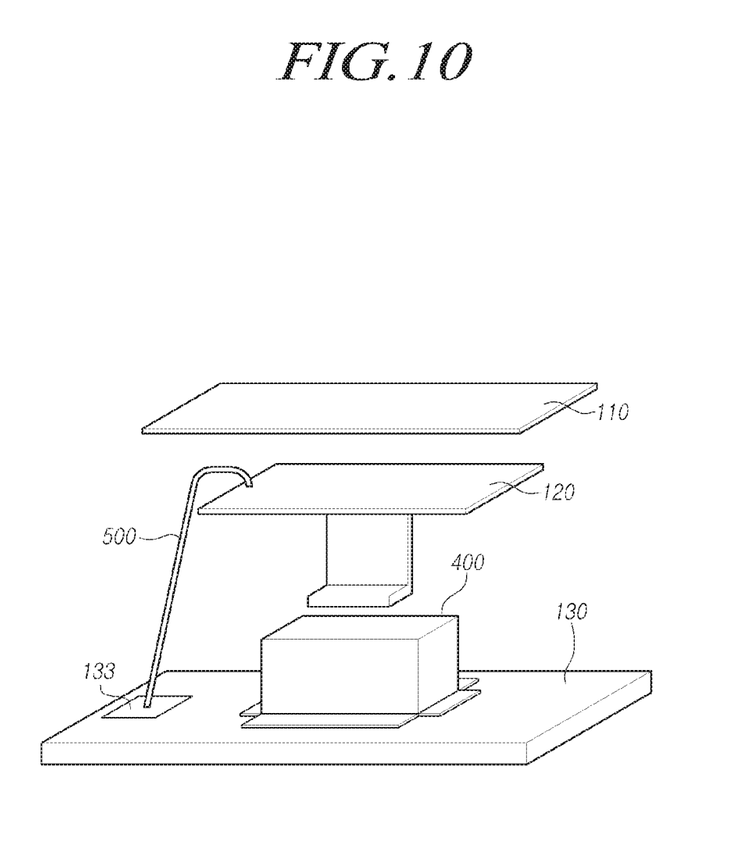
FIG. 10 is a perspective view schematically illustrating the structure of an apparatus for a non-contactive sensor having an ESD protection element according to further another embodiment of the present disclosure.

FIG. 10 is a perspective view schematically illustrating the structure of an apparatus for a non-contactive sensor having an ESD protection element according to further another embodiment of the present disclosure.

Referring to FIG. 10, the apparatus for a non-contactive sensor having an ESD protection structure according to further another embodiment of the present disclosure may include: a sensing member 120 that acquires sense information emitted from a detection target object 110; a circuit board 130 that is separately positioned below the sensing member 120 and includes a sensor IC 140 and one or more grounds 131 and 132; a first ESD protection element 400 that is positioned on the circuit board 130 and encloses entirely the sensor IC 140 protruding on the circuit board 130, and a second ESD protection element 500 that connects the circuit board 130 and the sensing member 120 and forms a path through which static electricity is applied to the ground 133.

Here, the first ESD protection element 400 is different from the ESD protection element described above with reference to FIGS. 2 to 4 and 9 and is the same as the ESD protection element illustrated in FIGS. 5 and 6. On the other hand, the second ESD protection element 500 is the same as the ESD protection element illustrated in FIGS. 7 to 9.

Details described with reference to FIG. 5 to 8 can be applied also to the apparatus for a non-contactive sensor illustrated in FIG. 10.

As described above, according to the apparatus for a non-contactive sensor having an ESD protection structure according to further another embodiment of the present disclosure, ESD is effectively prevented without addition of an ESD protection circuit pattern or a structural change of the sensor apparatus, and accordingly, there is an advantage of reducing the cost. In addition, according to the apparatus for a non-contactive sensor having an ESD protection structure according to further another embodiment of the present disclosure, since the ESD protection element is formed using a material that can minimizing the influence on a signal detected from a detection target object, there is an advantage of improving the reliability of the sensor apparatus.

As described above, according to the present disclosure, there is an advantage of effectively preventing ESD without addition of an ESD protection circuit pattern or a structural change in the sensor apparatus.

In the description presented above, although all the constituent elements configuring an embodiment of the present disclosure have been described as being combined as one and are combined to operate, the present disclosure is not necessarily limited to such an embodiment. In other words, one or more of all the constituent elements may be selectively combined and operate within the range of the object of the present disclosure. The above description has been presented to enable any person skilled in the art to make and use the technical idea of the present disclosure, and has been provided in the context of a particular application and its requirements. Various modifications, additions and substitutions to the described embodiments will be readily apparent to those skilled in the art, and the general principles defined herein may be applied to other embodiments and applications without departing from the spirit and scope of the present disclosure. The above description and the accompanying drawings provide an example of the technical idea of the present disclosure for illustrative purposes only. That is, the disclosed embodiments are intended to illustrate the scope of the technical idea of the present disclosure. Thus, the scope of the present disclosure is not limited to the embodiments shown, but is to be accorded the widest scope consistent with the claims. The scope of protection of the present disclosure should be construed based on the following claims, and all technical ideas within the scope of equivalents thereof should be construed as being included within the scope of the present disclosure.

REFERENCE SIGNS LIST

100: ESD simulator
110: target detection object
120: sensing member
130: circuit board
131: first ground
132: second ground
133: third ground
140: sensor IC
300, 400, 500: ESD protection element
310: cover member
320: support member

What is claimed is:

1. An apparatus for a non-contactive sensor having an ESD protection structure comprising:
  a sensing member that acquires sense information emitted from a detection target object;
  a circuit board that is separately positioned below the sensing member and includes a sensor IC and one or more grounds; and
  a first ESD protection element that is positioned on the circuit board and encloses at least a portion of the sensor IC protruding on the circuit board.

2. The apparatus for a non-contactive sensor according to claim 1,
wherein the sense information includes at least one or more of capacitance, a magnetic field, and inductance in the ESD protection structure.

3. The apparatus for a non-contactive sensor according to claim 1,
wherein a circuit pattern of the sensor IC has formed based on the sense information in the ESD protection structure.

4. The apparatus for a non-contactive sensor according to claim 2,
wherein the sense information is a magnetic field, and the sensor IC is a torque sensor IC included in a steering apparatus of a vehicle in the ESD protection structure.

5. The apparatus for a non-contactive sensor according to claim 1,
wherein the first ESD protection element forms a cover member enclosing an upper part and side parts of the sensor IC and forms a plurality of support members that are brought into contact with the ground in the ESD protection structure.

6. The apparatus for a non-contactive sensor according to claim 5,
wherein the support members are connected to a first ground and a second ground formed in the circuit board in the ESD protection structure.

7. The apparatus for a non-contactive sensor according to claim 6,
wherein the first ESD protection element is formed in a sheet form and has a thickness in the range of 5 μm to 50 μm in the ESD protection structure.

8. The apparatus for a non-contactive sensor according to claim 1,
wherein the first ESD protection element is formed using any one or more selected from a non-magnetic group composed of compounds or mixtures including Cu, Cr, Si, B, Ti, Zn, K, Li, and Al in the ESD protection structure.

9. The apparatus for a non-contactive sensor according to claim 2,
wherein the sense information is capacitance, and the sensor IC is a touch sensor IC included in a vehicle in the ESD protection structure.

10. The apparatus for a non-contactive sensor according to claim 2,
wherein the sense information is inductance, and the sensor IC is a gap sensor IC included in a vehicle in the ESD protection structure.

11. The apparatus for a non-contactive sensor according to claim 1, further comprising:
a second ESD protection element that connects the circuit board and the sensing member and forms a path through which static electricity is applied to the ground.

12. The apparatus for a non-contactive sensor according to claim 11,
wherein the sense information includes at least one or more of capacitance, a magnetic field, and inductance in the ESD protection structure.

13. The apparatus for a non-contactive sensor according to claim 11,
wherein a circuit pattern of the sensor IC has formed based on the sense information in the ESD protection structure.

14. The apparatus for a non-contactive sensor according to claim 12,
wherein the sense information is a magnetic field, and the sensor IC is a torque sensor IC included in a steering apparatus of a vehicle in the ESD protection structure.

15. The apparatus for a non-contactive sensor according to claim 12,
wherein the sense information is capacitance, and the sensor IC is a touch sensor IC included in a vehicle in the ESD protection structure.

16. The apparatus for a non-contactive sensor according to claim 12,
wherein the sense information is inductance, and the sensor IC is a gap sensor IC included in a vehicle in the ESD protection structure.

17. The apparatus for a non-contactive sensor according to claim 11,
wherein one side of the second ESD protection element is brought into contact with the sensing member, and the other side is brought into contact with the ground.

18. The apparatus for a non-contactive sensor according to claim 17,
wherein the second ESD protection element is formed in a rod shape and has a thickness in the range of 50 μm to 500 μm in the ESD protection structure.

19. The apparatus for a non-contactive sensor according to claim 11,
wherein the second ESD protection element is formed using any one or more selected from a non-magnetic group composed of compounds or mixtures including Cu, Cr, Si, B, Ti, Zn, K, Li, and Al in the ESD protection structure.

* * * * *